United States Patent [19]

Takamori et al.

[11] Patent Number: 4,613,827
[45] Date of Patent: Sep. 23, 1986

[54] WRITE CLOCK PULSE GENERATOR USED FOR A TIME BASE CORRECTOR

[75] Inventors: Tsutomu Takamori; Yoshiyuki Nakamura; Hitoshi Abe, all of Kanagawa, Japan

[73] Assignee: Sony Corporation, Tokyo, Japan

[21] Appl. No.: 758,341

[22] Filed: Jul. 24, 1985

[30] Foreign Application Priority Data

Jul. 28, 1984 [JP] Japan .................. 59-115642[U]

[51] Int. Cl.$^4$ .......................... H03L 7/08; H04N 5/93
[52] U.S. Cl. ................................... 331/20; 331/27; 358/19; 358/319; 358/326; 360/36.1
[58] Field of Search ................ 331/1 A, 20, 25, 27, 331/2; 358/319, 326, 19; 360/37.1, 51, 36.1, 36.2

[56] References Cited

U.S. PATENT DOCUMENTS 4,069,499 1/1978 Ninomiya .................. 358/19
4,120,000 10/1978 Ninomiya .................. 358/148
4,214,262 7/1980 Mizukami .................. 358/19

Primary Examiner—Siegfried H. Grimm
Attorney, Agent, or Firm—Lewis H. Eslinger; Alvin Sinderbrand

[57] ABSTRACT

A write clock pulse generator is disclosed, in which a horizontal synchronizing signal is separated from an input video signal and supplied to a PLL (phase locked loop) circuit to form a first clock with the frequency of $nf_H$ (n is an integer), a color burst signal is separated from the input video signal and used to drive a gate type variable oscillator to thereby form a second clock synchronized in phase with the color burst signal and whose average frequency is $nf_H$, a difference between the pulse widths of the clocks resulting from counting down the first and second clocks to 1/M and the frequency of the variable oscillator is controlled by the compared output therebetween, whereby to produce a second clock synchronized in phase with the color burst signal and the frequency of which is n times the horizontal synchronizing signal.

4 Claims, 13 Drawing Figures

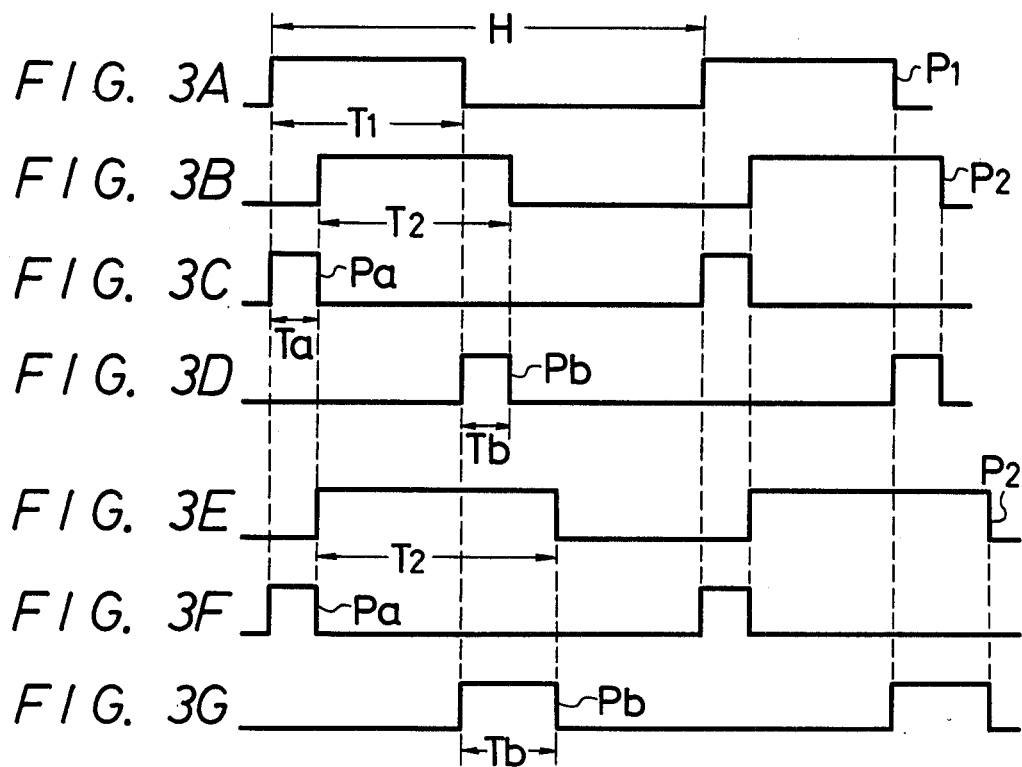
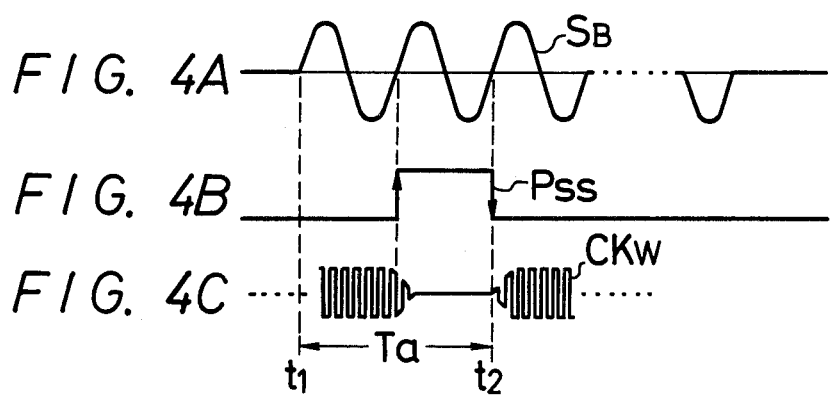

WRITE CLOCK PULSE GENERATOR USED FOR A TIME BASE CORRECTOR

BACKGROUND OF THE INVENTION

1. Field of the Invention

This invention relates generally to a clock generator and more particularly to a write clock generator used for a time base corrector (TBC) which is provided in the reproducing system of a video tape recorder (VTR).

2. Description of the Prior Art

Generally, a time base corrector is provided in the reproducing system of a professional VTR and so on in order to remove a jitter in a reproduced video signal or the like. This time base corrector requires a write clock generator for generating a write clock pulse which is capable of accurately following the jitter of the reproduced video signal and which is in phase with a color burst signal.

FIG. 1 is a block diagram showing an example of such prior art write clock pulse generator 10 for use with the time base corrector which is disclosed more in detail in, for example, U.S. Pat. No. 4,165,524 (by the same assignee).

Referring to FIG. 1, a reproduced video signal Sv applied to a terminal 1 is supplied to a synchronous separating circuit 2 in which a horizontal synchronizing signal $P_H$ is separated from the reproduced video signal Sv. This horizontal synchronizing signal $P_H$ is supplied to a PLL (phase locked loop) circuit 3 which forms a clock $CK_1$ of the frequency $nf_H$ (n is an integer and $f_H$ is a horizontal frequency) following the frequency fluctuation of the horizontal synchronizing signal $P_H$. In this example, n is selected to be 910 for the NTSC system and 1135 for the PAL system, respectively.

The reproduced video signal Sv is further supplied to a color burst separating circuit 4 in which a color burst signal $S_B$ is separated from the reproduced video signal Sv. This color burst signal $S_B$ is supplied to an APC (automatic phase control) circuit 5 which synchronizes the phase of the clock $CK_1$ supplied thereto. Thus, at an output terminal 6 led out from the APC circuit 5, there is developed a write clock $CK_W$ synchronized in phase with the color burst signal $S_B$ and the frequency of which is the same as that of the clock $CK_1$.

Though not shown, the write clock $CK_W$ is used as a sampling clock for analog-to-digital converting the reproduced video signal Sv and also as a write clock for a digital memory.

By the way, when the clock generating circuit 10 is arranged as described above, the APC circuit 5 for phase-synchronization generally includes a vast number of circuit elements and in which an analog signal processing system and a digital signal processing system exist therein in a mixed state so that this clock generating circuit 10 is not suitable for being formed as an IC (integrated circuit). Further, this prior art clock generating circuit 10 has the analog signal processing system so that its temperature characteristic is poor and that its operation is not stabilized.

OBJECTS AND SUMMARY OF THE INVENTION

Accordingly, it is an object of this invention to provide a write clock pulse generator the circuit scale of which is miniaturized and which is suitable for being formed into an IC (integrated circuit).

It is another object of this invention to provide a write clock pulse generator which is small in control error due to temperature fluctuation and hence which is stable in temperature characteristic.

It is a further object of this invention to provide a write clock pulse generator for use with a TBC (time base corrector) or the like which is provided in a reproducing system of a VTR (video tape recorder).

According to one aspect of this invention, there is provided a write clock pulse generator for a time base corrector having a phase locked oscillator responsive to a horizontal synchronizing pulse derived from a reproduced video signal for generating a first clock pulse having a time axis change same as that of said horizontal synchronizing pulse, a frequency of said first clock pulse being n times (n is an integer) the frequency of said horizontal synchronizing pulse, a color burst signal separating circuit for separating a color burst signal from said reproduced video signal, and a generating circuit responsive to said first clock pulse and said separated color burst signal for generating a write clock pulse, the phase and frequency of which are locked to those of said separated color burst signal and said horizontal synchronizing pulse, respectively comprising:

(a) a pulse signal generator responsive to said color burst signal for generating a control pulse signal having a pulse width corresponding to a predetermined wave length of said color burst signal, said control pulse signal being in phase with said color burst signal;

(b) a start-stop oscillator responsive to a generation of said control pulse signal for generating a second clock pulse the phase of which is in phase with said control pulse signal;

(c) first and second frequency dividers connected to said phase locked oscillator and said start-stop oscillator respectively and for frequency-dividing said first and second clock pulses;

(d) a synchronous circuit responsive to a generation of said control pulse for synchronizing dividing operations of said first and second frequency dividers;

(e) a comparator for comparing pulse widths of output pulses of said first and second frequency dividers; and (f) a control circuit responsive to an output signal of said comparator for controlling a frequency of said start-stop oscillator.

These and other objects, features and advantages of the write clock pulse generator according to this invention will become apparent from the following detailed description of the preferred embodiment taken in conjunction with the accompanying drawings, throughout which like reference numerals designate like elements and parts.

BRIEF DESCRIPTION OF THE DRAWINGS

FIGS. 3A to 3G and FIGS. 4A to 4C are respectively waveform diagrams useful for explaining the operation of the write clock pulse generator shown in FIG. 2.

DESCRIPTION OF THE PREFERRED EMBODIMENT

Now, an embodiment of the write clock pulse generator according to this invention will hereinafter be described with reference to FIGS. 2 to 5 in detail.

Figure 1:
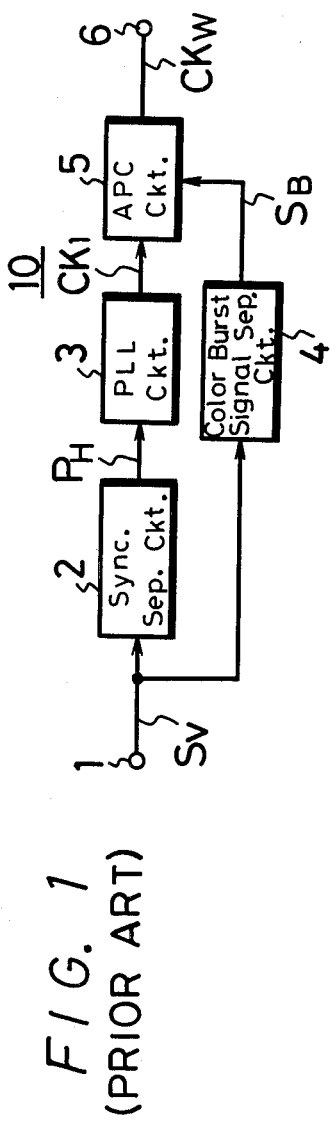
FIG. 1 is a block diagram showing an example of a prior art write clock pulse generator.
Figure 2:
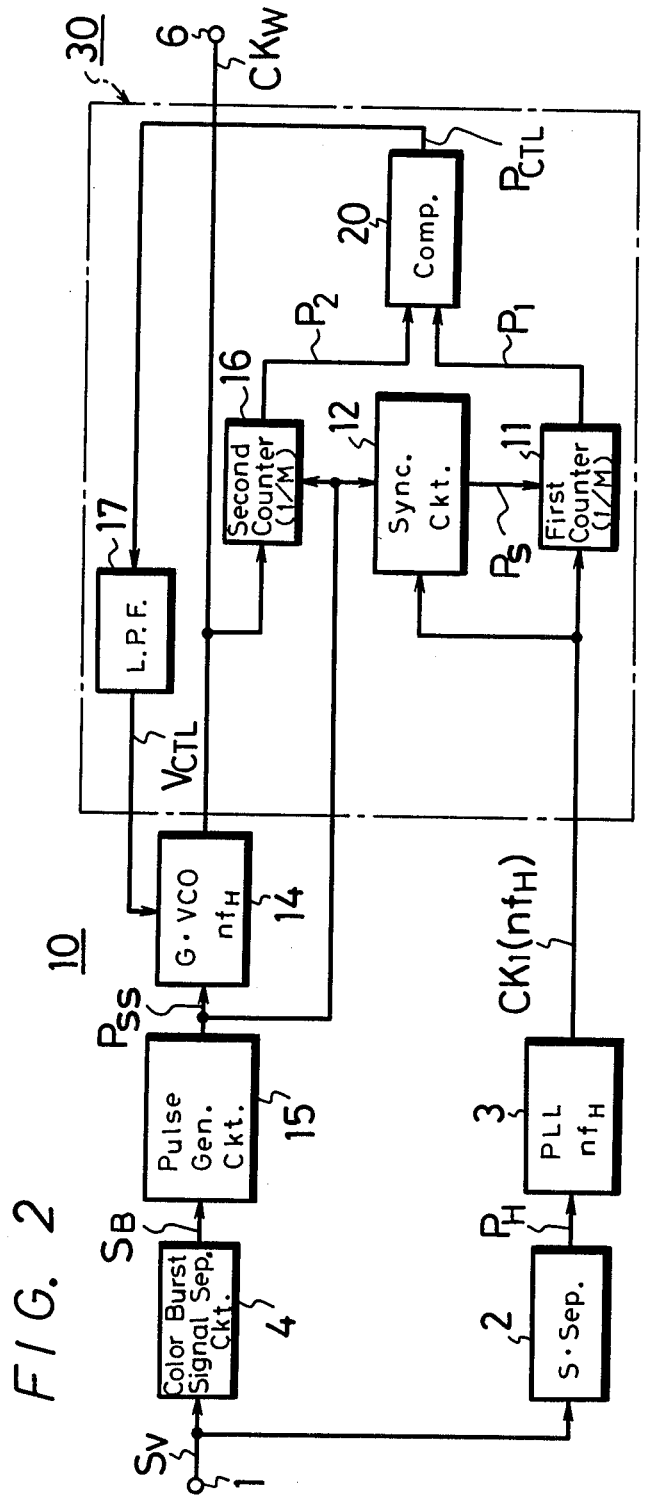
FIG. 2 is a block diagram showing an embodiment of a write clock pulse generator according to this invention.

FIG. 2 is a block diagram showing an embodiment of the write clock pulse generating circuit or generator according to this invention. In FIG. 2, like parts corresponding to those of FIG. 1 are marked with the same references and will not be described in detail.

Referring to FIG. 2, the reproduced video signal Sv applied to the terminal 1 is supplied to the synchronous separating circuit 2 in which the horizontal synchronizing signal $P_H$ is separated from the reproduced video signal Sv. This horizontal synchronizing signal $P_H$ is supplied to the PLL circuit 3 which then forms the clock (first clock) with the frequency $nf_H$ (n is an integer and $f_H$ is the horizontal frequency) following the frequency fluctuation of the horizontal synchronizing signal $P_H$ as mentioned before. The n is set similarly as described above.

The reproduced video signal Sv is further fed to the color burst signal separating circuit 4 which separates the color burst signal $S_B$ from the reproduced video signal $S_V$.

The first clock $CK_1$ is supplied to a first counter (frequency divider) 11 which is provided in a frequency difference detector 30 and thereby counted down to 1/M. In this case, M is an integer and a condition of n>M is established. In this embodiment, M is set to be 512. Accordingly, when this write clock pulse generator is applied to the time base corrector of the PAL system, the first counter 11 produces a first pulse $P_1$ (see FIG. 3A) the duty ratio of which is substantially about 50%.

The first counter 11 begins its count operation in synchronism with the color burst signal $S_B$. To this end, a start-stop pulse $P_{SS}$ synchronized with the color burst signal $S_B$ as will be described later and the first clock $CK_1$ are respectively supplied to a synchronous circuit 12 which extracts therefrom one pulse of the first clock $CK_1$ corresponding to one wave of the color burst signal $S_B$, for example, one wave of four to six waves which precisely indicates the phase of the color burst signal. This one pulse is supplied to the first counter 11 as a start pulse $P_S$ (not shown).

The color burst signal $S_B$ is supplied to a generating circuit 15 for generating the start-stop pulse $P_{SS}$ for a gate type variable oscillator 14 and then the generating circuit 15 produces the start-stop pulse $P_{SS}$ which is synchronized with the color burst signal $S_B$. In this embodiment, as shown in FIGS. 4A and 4B, the start-stop pulse $P_{SS}$ synchronized with the second wave of the color burst signal $S_B$ and for one wave length thereof is formed, by which the oscillation state of the variable oscillator 14 is controlled. The pulse width of the start-stop pulse $P_{SS}$ may be ½ wave length amount of the color burst signal $S_B$ and more preferably be selected in a range from one to several wave lengths amount thereof.

The center oscillation frequency (average frequency) of the variable oscillator 14 is selected to be $nf_H$, in which example, at the timing of the falling down edge of the start-stop pulse $P_{SS}$ the oscillation of the variable oscillator 14 begins, while at the timing of the rising up edge thereof the oscillation thereof is stopped.

Accordingly, as shown in FIG. 4C, the clock (the second clock) $CK_W$ derived from the variable oscillator 14 appears as an interrupting or intermittent oscillation clock the phase of which is synchronized with the color burst signal $S_B$.

This second clock $CK_W$ is developed at the output terminal 6 and will be used as the write clock.

Since the reproduced video signal Sv is written only in its picture portion, even if such intermittent clock is used as the write clock $CK_W$, there occurs no problem.

The second clock $CK_W$ is further fed to a second counter (frequency divider) 16, in which the second clock $CK_W$ is counted down to 1/M to thereby form the second pulse $P_2$. The count operation of the second counter 16 is carried out in synchronism with the burst signal $S_B$. In this case, as shown in FIG. 4, the operation timing of the second counter 16 is adjusted such that its count operation is started by the color burst signal $S_B$ (the color burst signal $S_B$ at time point $t_2$) under the condition that the second clock $CK_W$ obtained in synchronism with the falling down edge of the start-stop pulse $P_{SS}$ is supplied to the second counter 16.

As described above, if the second clock $CK_W$ with the average frequency $nf_H$ is counted down to 1/M by the second counter 16, it is possible to obtain the second pulse $P_2$ (see FIG. 3B) of which the duty ratio is similar to that of the first pulse $P_1$ from the first counter 11. In this case, the first and second pulses $P_1$ and $P_2$ are arranged to have a phase difference of Ta (see FIG. 3).

On the other hand, a pulse width $T_2$ of the second pulse $P_2$ is fluctuated by the oscillation frequency of the variable oscillator 14. When the average frequency of the second clock $CK_W$ is $nf_H$, the pulse width $T_2$ of the second pulse $P_2$ is substantially equal to a pulse width $T_1$ of the first pulse $P_1$. However, if the average frequency becomes lower than $nf_H$, the pulse width $T_2$ becomes larger than the pulse width $T_1$, or becomes as, for example, shown in FIG. 3E. That is, the second pulse $P_2$ is dependent on the oscillation frequency of the variable oscillator 14.

While the first pulse $P_1$ is also fluctuated in response to the jitter of the horizontal scanning frequency, it is regarded as to be constant for convenience sake of explanation.

The first and second pulses $P_1$ and $P_2$ are both supplied to a pulse width comparator 20. As described above, relative to the first pulse $P_1$, the second pulse $P_2$ is dependent on the oscillation frequency of the variable oscillator 14. Thus, if the interval Ta between the rising up edge of the first and second pulses $P_1$ and $P_2$ is kept constant for convenience sake of explanation, the interval Tb (see FIG. 3) between the falling down edges of the first and second pulses $P_1$ and $P_2$ appears as the fluctuation of the variable oscillation frequency. In addition, when the frequency of the second clock $CK_W$ is equal to that of the first clock $CK_1$, the pulse widths $T_1$ and $T_2$ becomes equal to each other so that at this time, $T_b = T_a$ should be established.

Accordingly, if the pulse intervals $T_a$ and $T_b$ are detected and in order to achieve the condition of $T_b = T_a$, the oscillation frequency of the variable oscillator 14 is controlled by a control voltage $V_{CTL}$ based on the output $P_{CTL}$ from the pulse width comparator 20, the second clock $CK_W$ is produced as the write clock with the frequency $nf_H$ that is locked to the phase of the burst signal $S_B$.

In this embodiment, in order to achieve the above-described control operation, the pulse width comparator 20 is constructed in the following manner.

Figure 5:
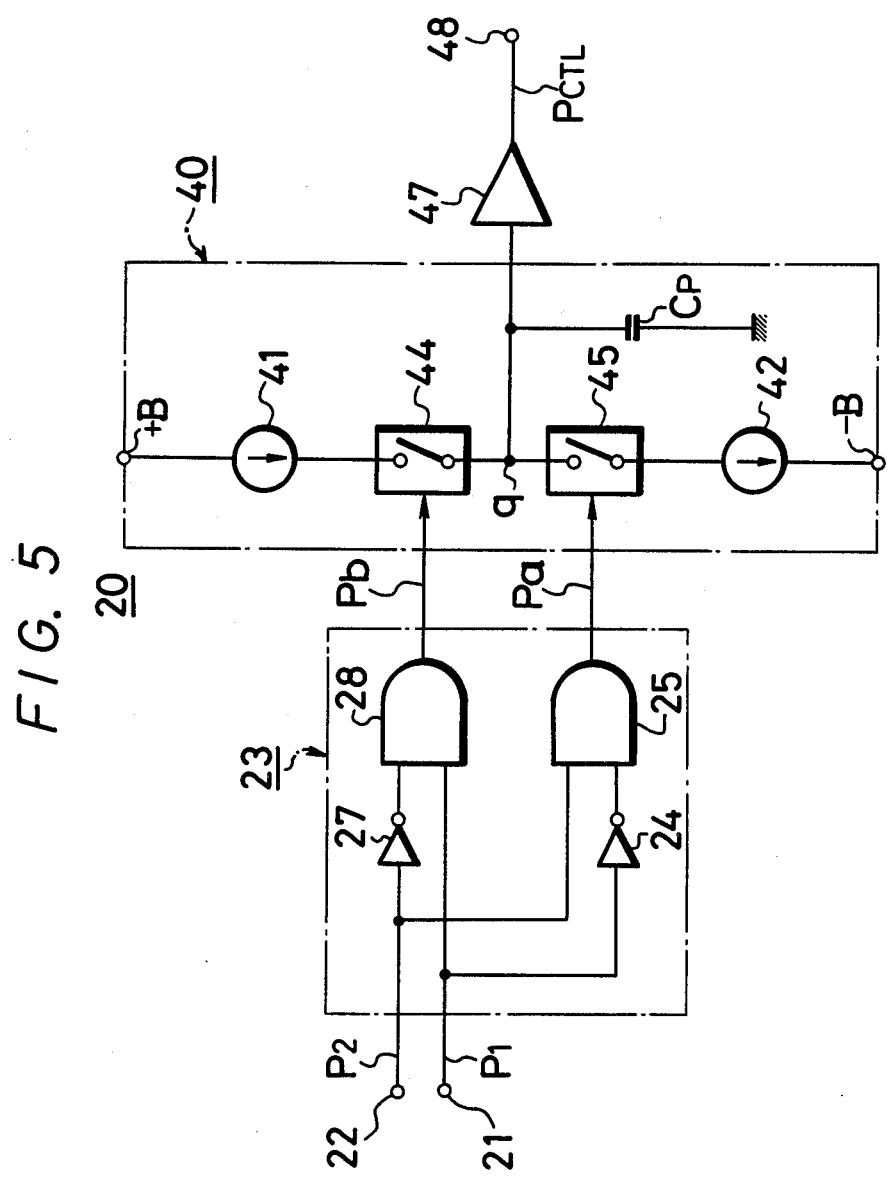
FIG. 5 is a block diagram showing an example of a pulse width comparator used in the present invention.

FIG. 5 is a block diagram showing an example of the pulse width comparator 20. Referring to FIG. 5, the first and second pulses $P_1$ and $P_2$ applied to input terminals 21 and 22 are supplied to a pulse interval detecting circuit 23, respectively. More specifically, if the second pulse $P_2$ and the first pulse $P_1$ passed through an inverter 24 are both fed to an AND circuit 25, from the AND circuit 25 there is obtained a control pulse Pa (FIG. 3C) with the pulse interval $T_a$. If on the other hand the first pulse $P_1$ and the second pulse $P_2$ passed through an inverter 27 are both supplied to an AND circuit 28, from the AND circuit 28 there is obtained a control pulse $P_b$ (FIG. 3D) with the pulse interval $T_b$.

A charge pump 40 is controlled by the control pulses $P_a$ and $P_b$.

As is known, the charge pump 40 is formed of a pair of current sources 41 and 42 connected in series between two voltage source $+B$ and $-B$, and a charging and discharging capacitor $C_P$ connected between a connection point q of the current sources 41, 42 and the ground. Between the connection point q and the respective current sources 41 and 42, there are connected switching elements 44 and 45, respectively. The switching element 44 is controlled to turn on and off by the control pulse $P_b$, while the other switching element 45 is controlled to turn on and off by the control pulse $P_a$.

Accordingly, when the frequency of the second clock $CK_W$ is equal to that of the first clock $CK_1$, $T_a = T_b$ is established as shown in FIGS. 3C and 3D so that the charging and discharging amounts to the capacitor $C_P$ become equal to each other. Accordingly, the terminal voltage across the capacitor $C_P$ at this time is delivered through a buffer amplifier 47 to an output terminal 48. Then, its detected voltage $P_{CTL}$ is filtered out by a low-pass filter 17 to become a control voltage $V_{CTL}$. In this case, the frequency of the variable oscillator 14 is not varied by the control voltage $V_{CTL}$.

On the other hand, if the frequency of the second clock $CK_W$ becomes lower than, for example, $nf_H$, the pulse interval $T_b$ of the control pulse $P_b$ becomes wider than the pulse interval $T_a$ of the control pulse $P_a$ so that the charged amount in the capacitor $C_P$ is increased. In accordance therewith, the control voltage $V_{CTL}$ is increased and the reverse bias of the varactor diode (not shown) provided in the variable oscillator 14 becomes deep so that the capacity thereof is decreased and thence the oscillation frequency of the variable oscillator 14 is made high. When the oscillation frequency thereof becomes equal to the frequency of the first clock $CK_1$, $T_a = T_b$ is established.

If the oscillation frequency of the variable oscillator 14 is higher than $nf_H$, the reverse control operation to the above will be carried out.

By the way, since the frequency of the first clock $CK_1$ is varied in response to the jitter in the reproduced video signal $S_V$, the pulse width $T_1$ of the first pulse $P_1$ is varied in response to this frequency fluctuation. Further, since the variable oscillator 14 is controlled so as to establish $T_a = T_b$, if the frequency of the first clock $CK_1$ is fluctuated, in response to such fluctuation, the variable oscillator 14 is controlled such that the frequency of the second clock $CK_W$ coincides with the frequency of the first clock $CK_1$.

Accordingly, at the output terminal 6, there is produced the write clock $CK_W$ having the frequency $nf_H$ following the jitter in the reproduced video signal $S_V$ and the phase of which is synchronized with the phase of the color burst signal $S_B$ of the reproduced video signal $S_V$.

While even though the switching elements 44 and 45 provided in the charge pump 40 are controlled by the first and second pulses $P_1$ and $P_2$ themselves, the predetermined write clock $CK_W$ may be produced. However, if the control pulses $P_a$ and $P_b$ are used as mentioned above rather than the first and second pulses $P_1$ and $P_2$, it is possible to obtain the write clock $CK_W$ with the frequency following the first clock frequency more precisely.

In other words, although current values $I_1$ and $I_2$ of the pair of current sources 41 and 42 used in the charge pump 40 should be equal to each other ($I_1 = I_2$) inherently, in practice, $I_1$ and $I_2$ become $I_1 \neq I_2$ due to the scattering of the circuit elements. Therefore, if the control pulses $P_a$ and $P_b$ based on the pulses $P_1$ and $P_2$ are used rather than the pulses $P_1$ and $P_2$ themselves, the operation periods of the current sources 41 and 42 can be reduced so that it becomes possible to reduce the influence by the scattering of the current values much more.

If the influence by the scattering of the current values can be reduced much more, the control accuracy for the variable oscillator 14 is increased by that much. Accordingly, it becomes possible to reduce the error of the write clock frequency relative to the first clock frequency to be small.

For this reason, it is preferable to control the charge pump 40 by the control pulses $P_a$ and $P_b$.

As set forth above, according to this invention, in order to detect the pulse width difference between the first clock $CK_1$ following the jitter in the reproduced video signal $S_V$ and the second clock $CK_W$ synchronized with the phase of the color burst signal $S_B$ of the reproduced video signal $S_V$, first and second pulses $P_1$ and $P_2$ having M clock pulse widths are generated and then the frequency of the second clock $CK_W$ is controlled based on the detected pulse width difference.

In consequence, according to the circuit arrangement of this invention, the circuit arrangement of the APC system is simplified so that the circuit scale can be miniaturized considerably. Also, since this APC system includes many circuit elements which process the signals in a digital fashion, it is easily formed into the IC.

Since the variable oscillator 14 can be controlled by the control voltage $V_{CTL}$ which is obtained on the basis of the digital processing, the control error due to the temperature variation is reduced and the stability thereof for temperature is increased so that it is possible to form the write clock $CK_W$ accurately following the input jitter.

Further, when the write clock pulse generator is formed into IC, this write clock pulse generator can be formed as a non-adjusting circuit, and so on.

Therefore, this invention is very suitable for the application of the TBC or the likes provided in the reproducing system of the VTR.

The above description is given on a single preferred embodiment of the invention, but it will be apparent that many modifications and variations could be effected by one skilled in the art without departing from the spirit or scope of the novel concepts of the invention, so that the scope of the invention should be determined by the appended claims only.

We claim as our invention:

1. A write clock pulse generator for a time base corrector having a phase locked oscillator responsive to a horizontal synchronizing pulse derived from a reproduced video signal for generating a first clock pulse having a time axis change same as that of said horizontal synchronizing pulse, a frequency of said first clock pulse being n times (n is an integer) the frequency of said horizontal synchronizing pulse, a burst signal separating circuit for separating a color burst signal from said reproduced video signal, and a generating circuit responsive to said first clock pulse and said separated color burst signal for generating a write clock pulse, the phase and frequency of which are locked to those of said separated color burst signal and said horizontal synchronizing pulse, respectively comprising:

(a) a pulse signal generator responsive to said color burst signal for generating a control pulse signal having a pulse width corresponding to a predetermined wave length of said color burst signal, said control pulse signal being in phase with said color burst signal;

(b) a start-stop oscillator responsive to generation of said control pulse signal for generating a second clock pulse the phase of which is in phase with said control pulse signal;

(c) first and second frequency dividers connected to said phase locked oscillator and said start-stop oscillator and for frequency-dividing said first and second clock pulses;

(d) a synchronous circuit responsive to generation of said control pulse for synchronizing dividing operations of said first and second frequency dividers;

(e) a comparator for comparing pulse widths of output pulses of said first and second frequency dividers; and (f) a control circuit responsive to an output signal of said comparator for controlling a frequency of said start-stop oscillator.

2. The write clock pulse generator according to claim 1, in which a dividing ratio of said first frequency divider is equal to that of said second frequency divider.

3. The write clock pulse generator according to claim 2, in which said comparator is a charge pump type comparator.

4. The write clock pulse generator according to claim 3, in which said charge pump type comparator includes a couple of inverters and AND gates, said output pulse of said first frequency divider is applied to one of said inverters and AND gates, said output pulse of said second frequency divider is applied to the other of said inverters and AND gates, output signals of said inverters are connected to said AND gates, respectively and first and second current sources for charging and discharging a capacitor in response to output signals of said couple of AND gates.

* * * * *